United States Patent
Assadi

(10) Patent No.: US 6,642,963 B1
(45) Date of Patent: *Nov. 4, 2003

(54) SILYLATION LAYER FOR OPTICAL DEVICES

(75) Inventor: Azar Assadi, Tempe, AZ (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/106,539

(22) Filed: Jun. 29, 1998

(51) Int. Cl.[7] .................................... H04N 5/335
(52) U.S. Cl. ........................ 348/273; 348/294
(58) Field of Search ................. 348/294, 308, 348/273, 272, 342, 335; 430/7, 169; 257/215, 440; 438/57, 60, 70; 250/208.1

(56) References Cited

U.S. PATENT DOCUMENTS

| | | | | |
|---|---|---|---|---|
| 4,064,532 A | * | 12/1977 | Yamanaka | 348/275 |
| 4,315,978 A | * | 2/1982 | Hartman | 257/440 |
| 4,400,454 A | * | 8/1983 | Sato et al. | 430/7 |
| 4,565,756 A | * | 1/1986 | Needs et al. | 430/7 |
| 4,600,833 A | * | 7/1986 | Shibata et al. | 250/216 |
| 4,706,114 A | * | 11/1987 | Cross | 348/222 |
| 4,793,692 A | * | 12/1988 | Kamio et al. | 349/106 |
| 4,896,207 A | * | 1/1990 | Parulski | 348/242 |
| 5,183,722 A | * | 2/1993 | Tsutsumi et al. | 430/169 |
| 5,493,335 A | * | 2/1996 | Parulski et al. | 348/273 |
| 5,528,295 A | * | 6/1996 | Wagner | 348/273 |
| 5,591,553 A | * | 1/1997 | Snelling | 430/42 |
| 5,596,023 A | * | 1/1997 | Tsubota et al. | 430/20 |
| 5,667,920 A | * | 9/1997 | Chiulli et al. | 430/7 |
| 5,677,202 A | * | 10/1997 | Hawkins et al. | 437/3 |
| 5,677,385 A | * | 10/1997 | Miyake et al. | 525/286 |
| 5,847,015 A | * | 12/1998 | Tajima et al. | 430/7 |
| 5,866,298 A | * | 2/1999 | Iwamoto et al. | 430/7 |
| 5,871,871 A | * | 2/1999 | Hogan et al. | 430/7 |
| 5,914,749 A | * | 6/1999 | Bawolek et al. | 348/273 |
| 5,981,111 A | * | 11/1999 | Irita et al. | 430/7 |
| 5,983,057 A | * | 11/1999 | Matsuo et al. | 348/207 |
| 6,020,582 A | * | 2/2000 | Bawolek et al. | 250/208.1 |

FOREIGN PATENT DOCUMENTS

| | | | |
|---|---|---|---|
| JP | 4-315103 | * | 11/1992 |
| JP | 7-145226 | * | 6/1995 |

* cited by examiner

*Primary Examiner*—Aung S. Moe
(74) *Attorney, Agent, or Firm*—Blakely, Sokoloff, Taylor & Zafman LLP

(57) ABSTRACT

An optical device that includes a filter material overlying an area over a photosensitive portion of the device. The optical device also includes a silylation layer overlying the filter material.

4 Claims, 12 Drawing Sheets

SILYLATION LAYER FOR OPTICAL DEVICES

BACKGROUND OF THE INVENTION

1. Field of the Invention

The invention relates to optical devices and more particularly to protecting and/or stabilizing color filter material overlying optical devices.

2. Description of Related Art

Digital imaging systems, such as for example digital cameras, utilize integrated circuit devices or chips as image capturing devices. An imaging system, such as a camera, uses light to capture an image on a semiconductor-based chip. The chip replaces film in traditional film-based systems. In a digital camera, an image sensor is configured, in its simplest form, to capture a monochrome or color image by way of field effect transistors (FETs), such as complementary metal oxide semiconductor (CMOS) devices or charge coupled devices (CCDs).

In one example, the image sensor is a semiconductor chip made up of a number of photosensing structures, such as photodiodes, each photodiode capable of absorbing light. In color applications, each photodiode generally absorbs light through a color filter that represents a particular wavelength of light in the visible spectrum corresponding to the image sensed.

The image sensor contains a plurality of pixels, such as for example 480 rows by 640 columns of pixels. In general, each pixel contains a photosensing structure, such as a photodiode, and other pixel circuitry. The photosensing structure defines a photosensing region or area of the pixel that responds to light while the pixel circuitry, generally speaking, drives a light signal from the photosensing region or area to other process circuitry.

As noted above, one method of converting a monochromatic digital imager into a color imager involves absorbing light through a color filter. The color performance of any color filter concerns the ability of the filter to select color corresponding to the desired wavelength of the visible spectrum of the color filter array (CFA) material. A common color filter material is spin coated, dyed- or pigmented-photoresist CFA material. The commonly used CFA materials generally experience aging problems, notably the deterioration of color performance. The deterioration is accelerated by exposure of the CFA material to elevated temperature or moisture. The transmissivity of CFA material changes due to exposure of the material to these and other deleterious environmental effects. This degradation is most evident with respect to Blue CFA material. One experiment found the transmissivity of Blue CFA material was reduced about 40% after ten hours in a 230° C. exposure. This effect will be magnified in the presence of humidity. Other CFA materials (e.g., Red, Green, etc.) also see significant reductions.

Thus, what is needed is a way to protect CFA material from aging and environmental effects. The protection should not effect the performance of the CFA material or the image sensing or displaying properties of the device.

SUMMARY OF THE INVENTION

An optical device that includes a filter material overlying an area over a photosensitive portion of the device. The optical device also includes a silylation layer overlying the filter material.

Additional features and benefits of the invention will become apparent from the detailed description, figures, and claims set forth below.

BRIEF DESCRIPTION OF THE DRAWINGS

FIG. 3b shows a schematic perspective top view of the sensor of FIG. 3a.

DETAILED DESCRIPTION OF THE INVENTION

The invention relates to an optical device, such as an image sensor of an integrated circuit. In one embodiment, the optical device has a filter material overlying an area over the device. The optical device also includes a silylation layer overlying the filter material. The silylation layer acts as a sealant to protect the filter material of the device from degradation particularly by moisture, temperature, and aging. The silylation layer may overlie the sensor portion of an optical device that is an image sensor. The silylation layer may also overlie the non-sensor portion of an image sensor to act as a transparent scratch protection layer to protect the sensor, particularly in the device pick-and-place processing described in detail herein. In another aspect, the invention relates to an imaging system, such as a camera, that incorporates an image sensor such as described above.

Figure 1:
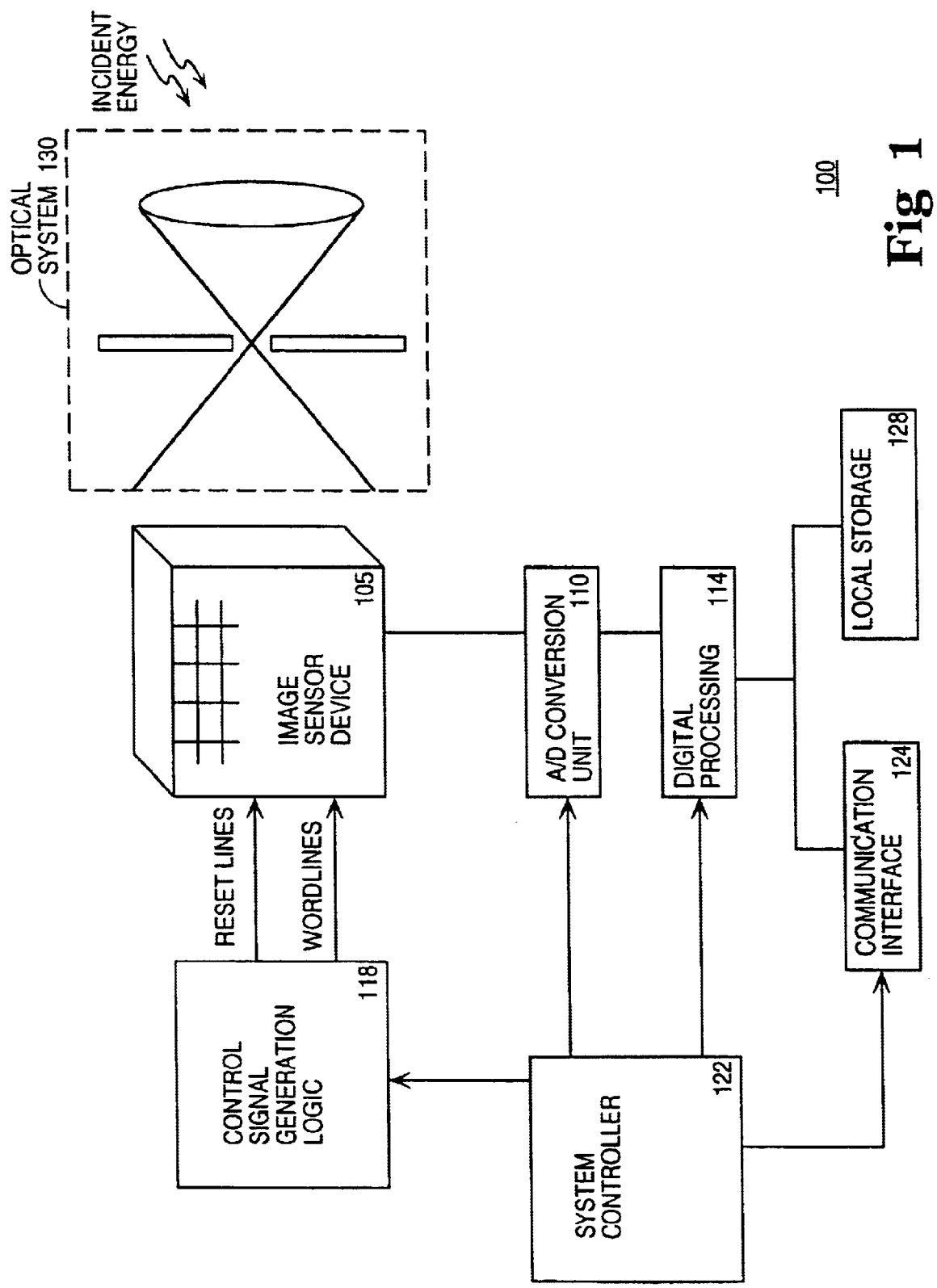
FIG. 1 is a diagram showing an imaging system incorporating an image sensor of an embodiment of the invention.

FIG. 1 illustrates an embodiment of an imaging system. Imaging system 100 has an optical system 130 that channels the incident energy, e.g., light, to create an optical image on image sensor or image sensing device 105. Control signal generation logic 118 is provided to generate reset signals in word lines needed to control photosensors of the image sensor 105. Output values (sensor signals) may be processed in analog form before being fed to an analog-to-digital (A/D) conversion unit 110 that in turn feeds digital processing block 114. Analog signal processing, A/D unit 110, and portions of the digital processing block 114 may be located on the same die as the sensor array. The digital processing may include hard-wired logic and/or a programmed processor that performs a variety of digital functions, including preparing digital image data based on the sensor signals for storage or transmission.

Transmission of the image data to an external processing system may be accomplished using communication interface 124. For instance, as a digital camera, system 100 will contain a communication interface that implements a computer peripheral bus standard such as universal serial bus (USB) or IEEE 1394-1995. Imaging system 100 may also contain local storage 128 of the non-volatile variety including, for instance, a solid state memory such as a removable memory card, a rotating magnetic device, or other suitable memory device for permanent storage of digital image data. The operation of system 100 may be orchestrated by system controller 122 that may include a conventional microcontroller responding to instructions stored as firmware.

Figure 2:
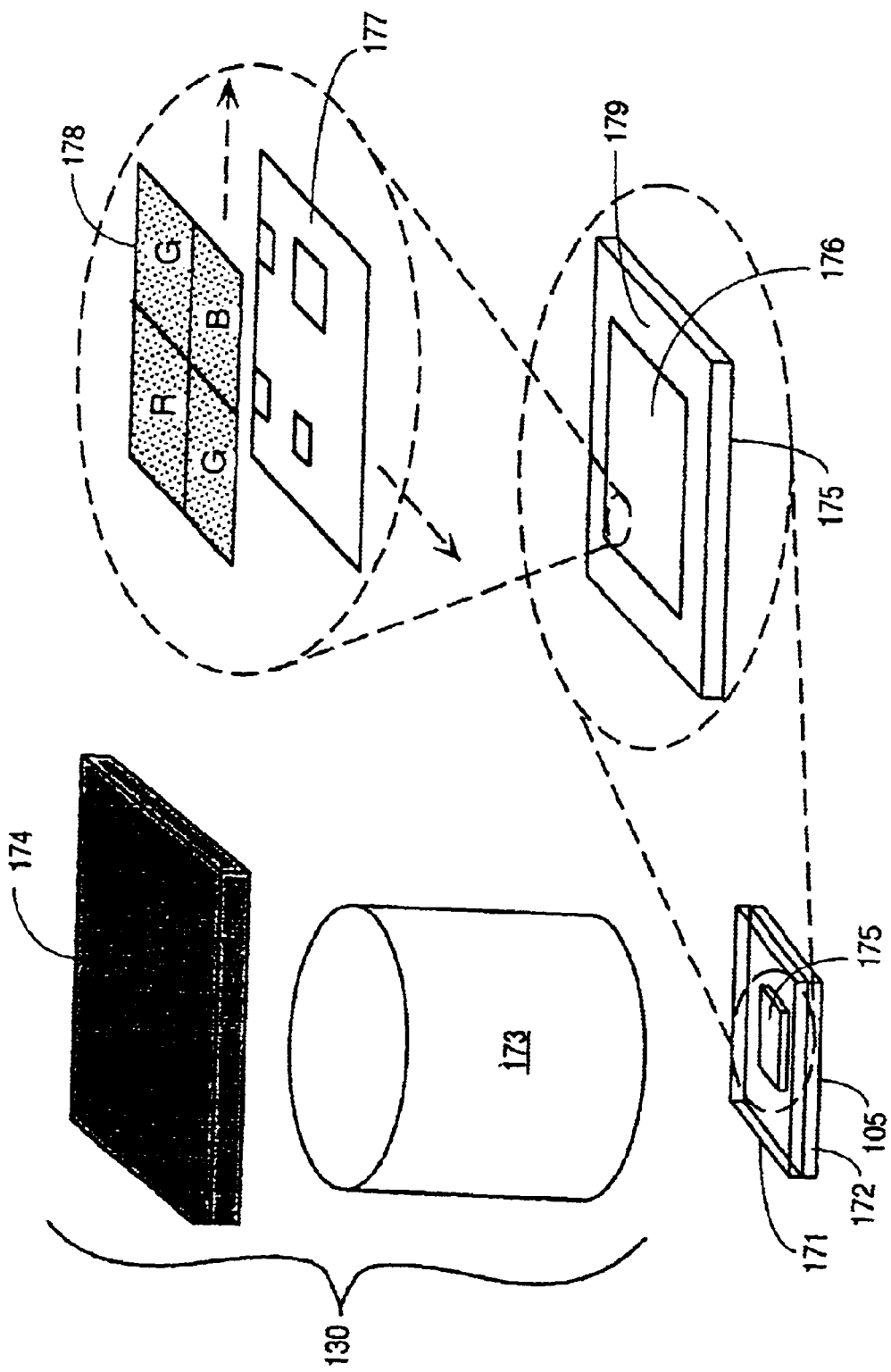
FIG. 2 shows a diagrammatical view of a portion of the imaging system of FIG. 1.

FIG. 2 shows a diagrammatical view of an embodiment of a portion of a digital imaging system including optical system 130 and image sensor device 105. Image sensor device 105 includes image sensor 175 in package 172. Conventional materials for package 172 include, but are not limited to, ceramic and plastic. In one embodiment, the top surface of the package includes a transparent cover substrate 171, such as glass or plastic, that overlies sensor 175.

Overlying image sensing device 105 and referenced as optical system 130 is lens assembly 173 and infrared blocking filter 174. Infrared blocking filter 174 overlies lens assembly 173 and serves to inhibit infrared light from striking image sensor device 105.

In the insert of FIG. 2 is a magnified view of sensor 175. A magnified view of sensor 175 in turn shows some additional sensor components. Included within the components shown in FIG. 2 is the uppermost metal layer 177 having illustrative openings intended to modulate pixel responsivity. Overlying metal layer 177 is an array or mosaic of color filter array (CFA) material 178 covering, in this instance, four different pixels of sensor 175: One Red, two Green, and one Blue. The array or mosaic represents an illustrative tiling pattern for CFA material 178.

Figure 3A:
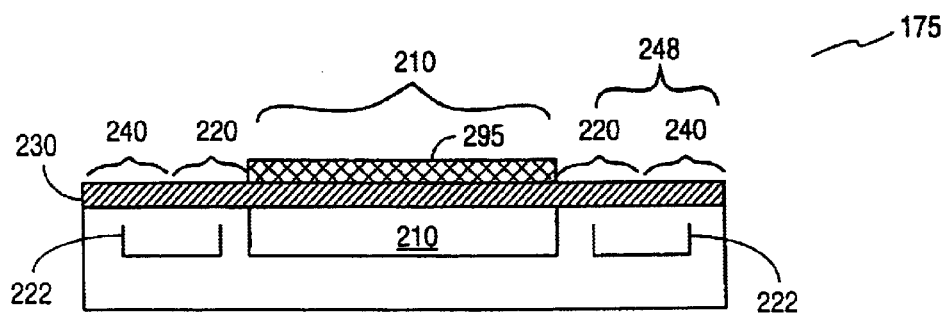
FIG. 3a shows a schematic side view of the image sensor of FIG. 1 that may be used in an embodiment of the invention.
Figure 3B:
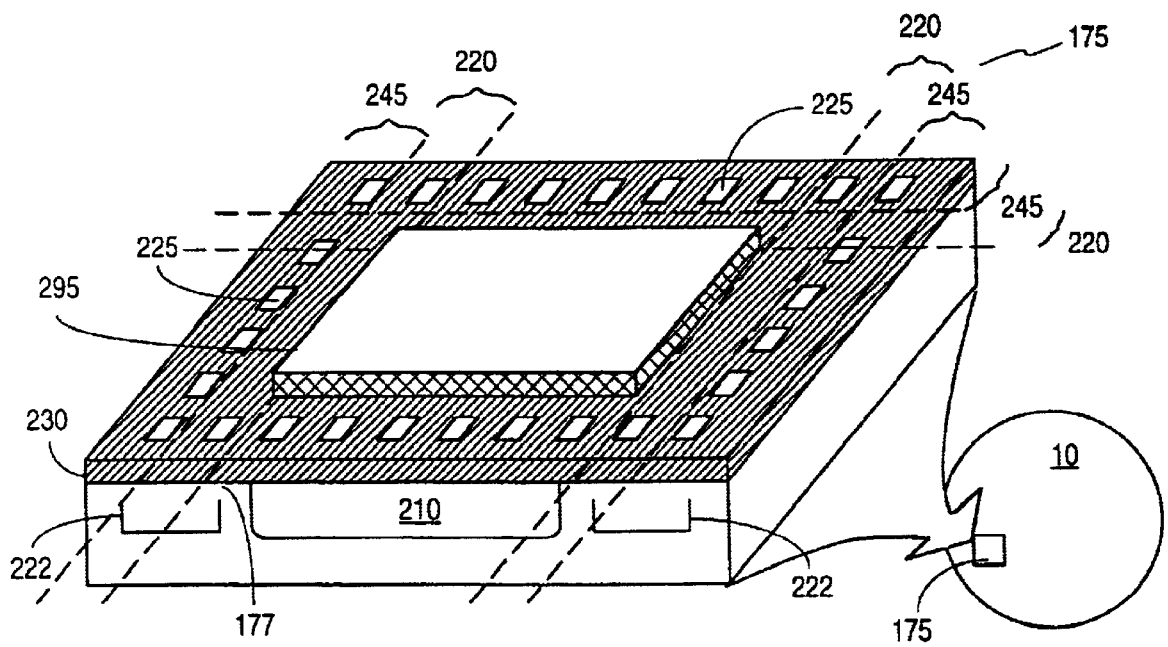

In one example, the image sensor is a chip made up of a number of photodiodes, each photodiode capable of absorbing light. FIG. 3a shows a schematic, planar side view of sensor 175. FIG. 3b illustrates a top perspective view of image sensor 175. Sensor 175 is fabricated as part of a die or wafer 10 with a plurality of other devices. Once formed, individual sensors are separated from one another typically by a sawing process. The individual image sensors are then placed in a package, such as package 172, of an imaging system.

In FIGS. 3a and 3b, the photosensing region or area is illustratively represented by sensor area 210. In addition to sensor area 210, image sensor 175 contains additional logic circuitry 220 that operates the individual pixels and drives signals from the pixels off sensor 175. In FIGS. 3a and 3b, the device circuitry occupies an area of image sensor 175 illustratively represented by logic area 220. It is to be appreciated that device circuitry is not limited to logic area 220. Logic area 220 typically represents an area around the periphery of device circuitry as opposed to photosensing structures, like photodiodes.

To power image sensor 175 and to drive signals off sensor 175, sensor 175 contains bond pads 225. Bond pads 225 are generally arranged on the periphery or top surface of sensor 175 and surround sensor area 210 and logic area 220. Bond pads 225 are typically located on the extreme periphery of sensor 175 in bond pad area 240. Bond pads 225 are electrically linked or coupled to device circuitry 222. Logic area 220 and bond pad area 240 collectively define non-sensor area 248, separate from sensor area 210. Overlying the top surface of image sensor 175 is transparent passivation layer 230. Passivation layer 230 is, for example, silicon nitride ($Si_3N_4$) or silicon oxynitride ($Si_xO_yN_z$). $Si_3N_4$ and $Si_xO_yN_z$ are chosen because of their transparent properties and their particular resistance to environmental contaminants, particularly moisture. Passivation layer 230 is deposited to a suitable thickness, such as for example approximately 8,000 angstroms (Å). Passivation layer 230 overlies the entirety of sensor 175, including sensor area 210 and non-sensor area (logic area 220 and bond pad area 240).

Overlying passivation layer 230, particularly in sensor area 210, is CFA material 295 such as dyed- or pigmented-photoresist. The CFA material is patterned into an array of color filter channels, one channel typically above one pixel. The color channels selectively allow light corresponding to a predetermined range of the visible spectrum to pass through a channel to imaging sensor 175. The group of color filter channels (e.g., Red, Green, Blue) make up a color system that either alone or, generally, by a mathematical manipulation, match or predict the human eye response.

Figure 4A:
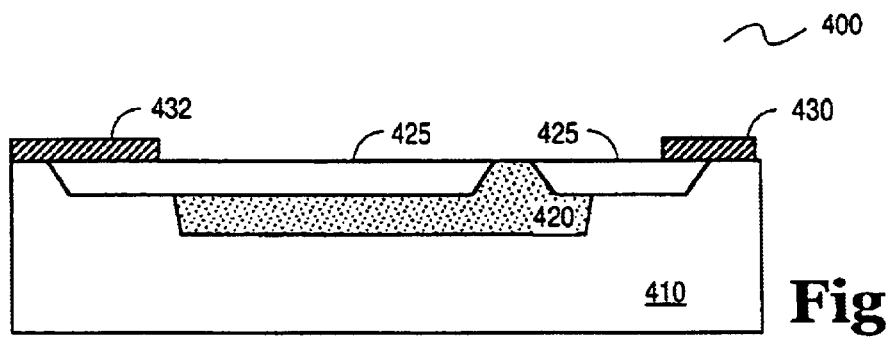
FIG. 4a shows a cross-sectional side view of a pixel after fabrication of active devices and a photosensing portion in accordance with an embodiment of the invention.

FIGS. 4a–4l illustrate cross-sectional side views of one embodiment of a process of forming a pixel in a pixel array. In this example, an image sensing device is a semiconductor chip made up of a number of pixels, each pixel capable of absorbing light. FIG. 4a illustrates a pixel of the invention after fabrication of active devices by conventional processing methods. Pixel 400 is formed of a semiconductor substrate, such as for example an n-type silicon substrate having an $n^+$-type region 420 in $p^+$-type epitaxial layer 410. The $n^+$-type/$p^+$-type interface forms a photosensing region or photodiode region of the pixel. In general, each pixel contains a photosensing structure such as a photodiode, and other pixel circuitry. FIG. 4a shows other elements, including trench oxide 425 and polysilicon layers 430 and 432.

Figure 4B:
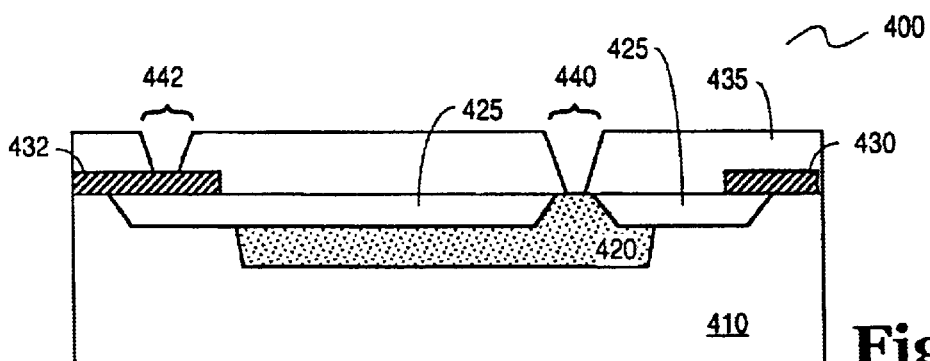
FIG. 4b shows the pixel of FIG. 4a after the subsequent processing step of depositing and patterning a first dielectric layer over the active devices.

FIG. 4b illustrates the pixel of FIG. 4a after the subsequent processing steps of depositing and patterning a first dielectric layer or ILD0 layer 435. Once deposited and formed, ILD0 layer 435 is patterned and etched to form vias 440 (to n-well 420) and 442 (to polysilicon layer 432). In one example, via lithography involves coating ILD0 layer 435 with a photoresist material, exposing the photoresist material, and removing the unexposed photoresist in a developing step. Vias 440 and 442 are then etched with a conventional etchant and the photoresist mask material removed. Via lithography and etch are well known in the art and employ conventional processing steps and processing equipment.

Figure 4C:
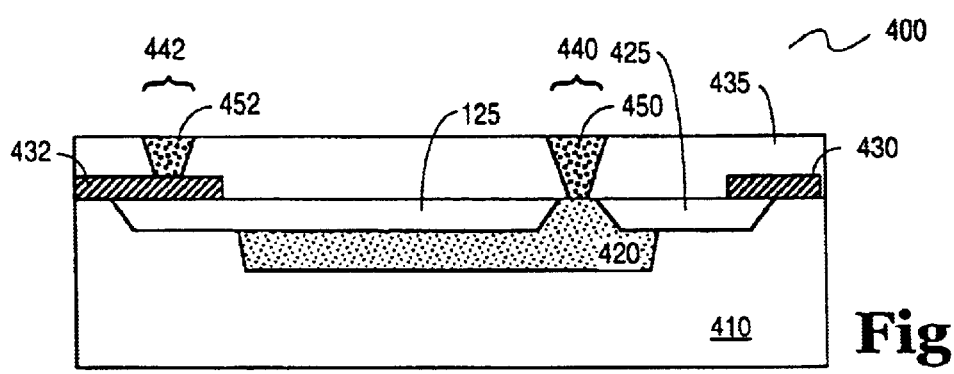
FIG. 4c shows the pixel of FIG. 4a after the subsequent processing step of depositing and planarizing a contact through the first layer of dielectric material.

FIG. 4c shows the pixel after the subsequent processing steps of depositing and planarizing a metal to vias 440 and 442 to form contacts 450 and 452, respectively. In one embodiment, the metal is a chemical vapor deposited (CVD) tungsten. The tungsten is planarized, for example, by a conventional chemical-mechanical polish.

Figure 4D:
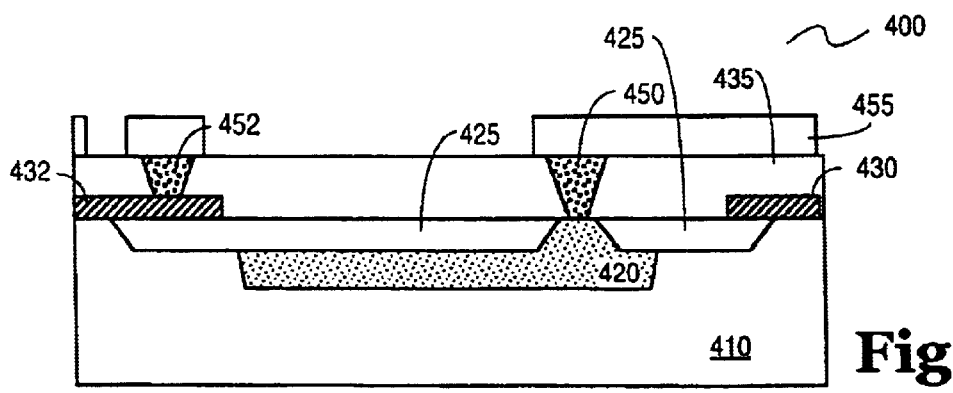
FIG. 4d shows the pixel of FIG. 4a after the subsequent processing step of depositing and patterning a first metal layer over the first dielectric layer.

FIG. 4d shows the pixel after the subsequent processing step of depositing and patterning a first metal layer 455 over ILD0 layer 435, to contacts 450 and 452, respectively. First metal layer 455 is, for example, an aluminum or aluminum alloy. First metal layer 455 is deposited and patterned by conventional processing steps and processing equipment.

Figure 4E:
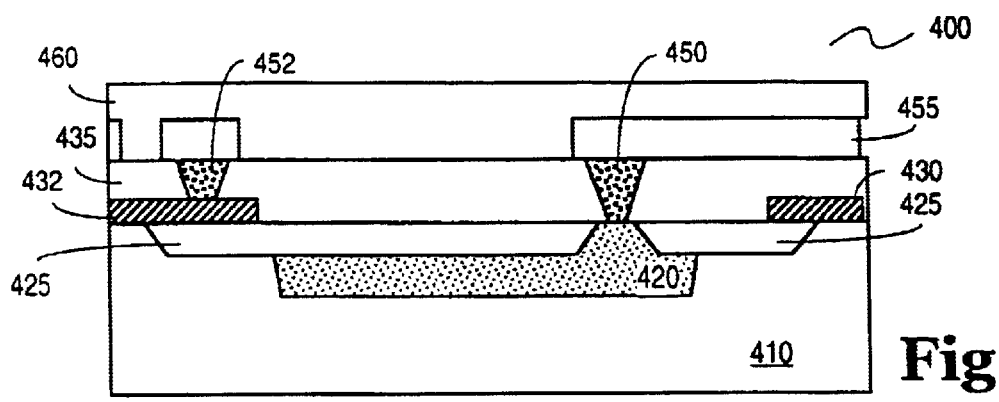
FIG. 4e shows the pixel of FIG. 4a after the subsequent processing step of depositing and patterning a second dielectric layer.

FIG. 4e shows the pixel after the subsequent processing step of depositing and patterning a second dielectric layer or ILD1 layer 460 over first metal layer 455 to electrically isolate first metal layer 455 from additional conductive materials. At this time, ILD1 layer 460 is planarized and openings are made where desired to first metal layer 455. Contacts, such as for example CVD tungsten contacts, are then formed to first metal layer 455 (contacts not shown in this cross-section). The planarizing, lithography, etching, and contact deposition to first metal layer 455 are not shown, but would follow conventional processing steps and processing equipment as noted above with similar steps.

Figure 4F:
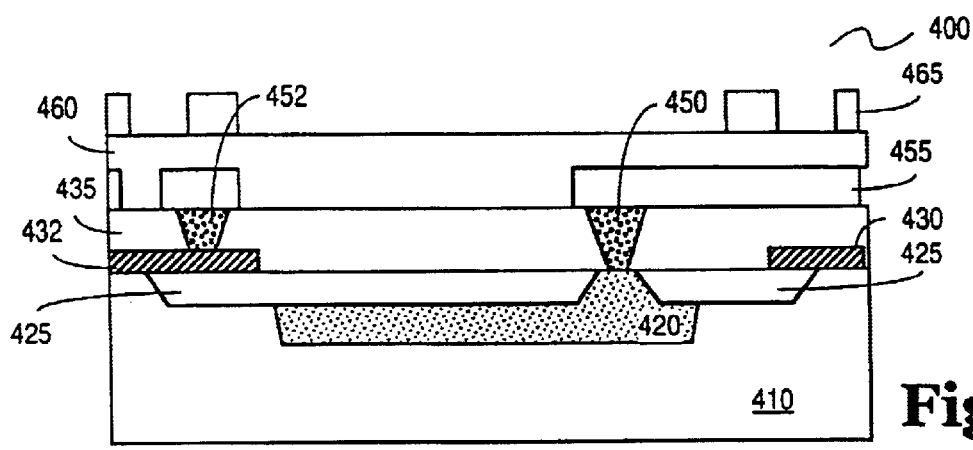
FIG. 4f shows the pixel of FIG. 4a after the subsequent processing step of depositing and patterning a second metal layer over the second dielectric layer.
Figure 4G:
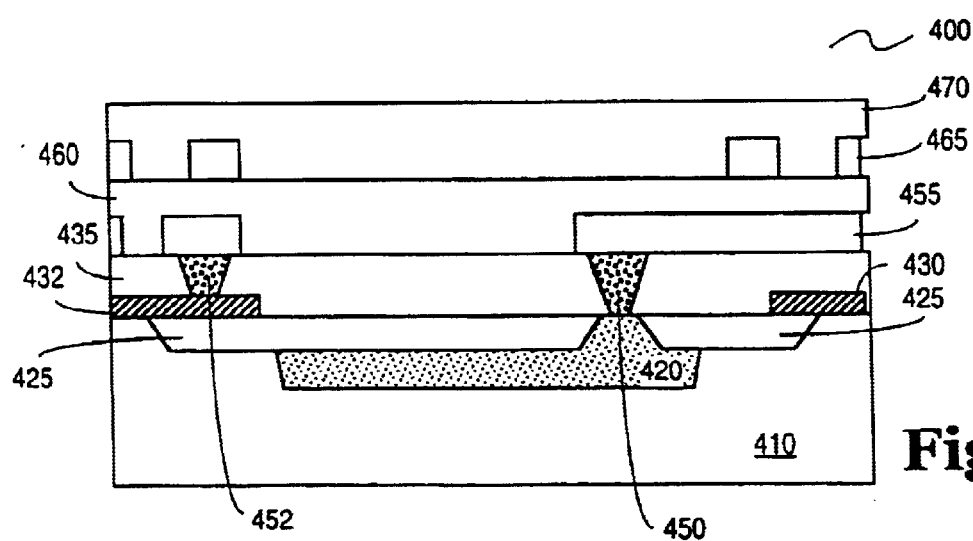
FIG. 4g shows the pixel of FIG. 4a after the subsequent step of depositing and patterning a third layer of dielectric.

FIG. 4f shows the pixel after the subsequent processing step of depositing and patterning a second metal layer 465 over ILD1 layer 460. Second metal layer 465 is typically an aluminum or aluminum alloy layer similar to first metal layer 455. Next, second metal layer 465 is electrically isolated by a third dielectric layer or ILD2 layer 470 as shown in FIG. 4g. Next, ILD2 layer 470 is planarized, such as for example by a chemical mechanical polish, then openings are etched through ILD2 layer 470 to, for example, second metal layer 465 and contacts, such as for example, CVD tungsten contacts, are deposited in the vias. The polishing, lithography, etching, and contact deposition and polish steps are not shown.

Figure 4H:
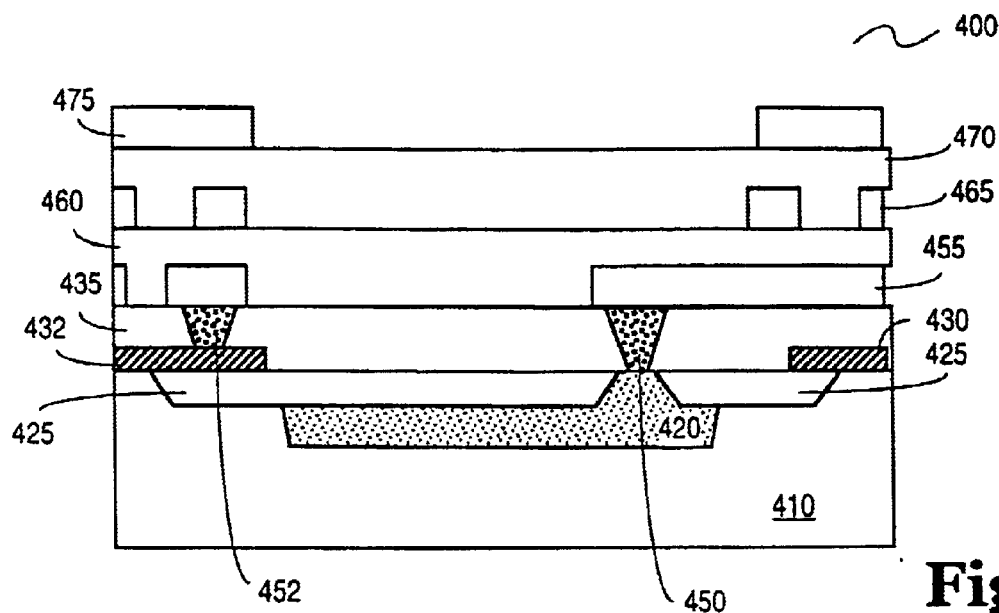
FIG. 4h shows the pixel of FIG. 4a after the subsequent processing step of depositing and patterning a third metal layer over the third dielectric layer.
Figure 4I:
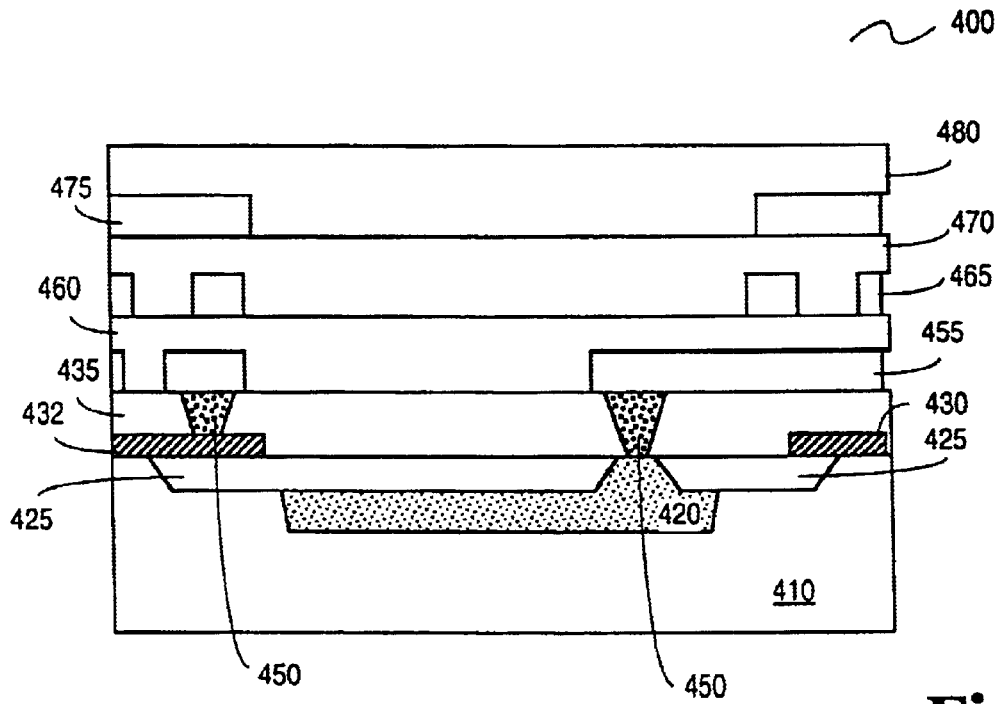
FIG. 4i shows the pixel of FIG. 4a after the subsequent processing step of depositing and patterning a fourth dielectric layer over the third metal layer.

FIG. 4h shows the pixel after the subsequent processing step of depositing third metal layer 475 over planarized ILD2 layer 470. This is followed by the deposition of a fourth dielectric layer or ILD3 layer 480 over the patterned third metal layer 475. ILD3 layer 480 is planarized and vias or openings are made to, for example, third metal layer 475. The pixel after ILD3 layer 480 is planarized as shown in FIG. 4i. Contacts, such as for example CVD tungsten contacts, are then formed to third metal layer 475 (vias and contacts not shown in this cross-section). The steps of polishing, lithography, etching, and contact deposition and polish are not shown.

Figure 4J:
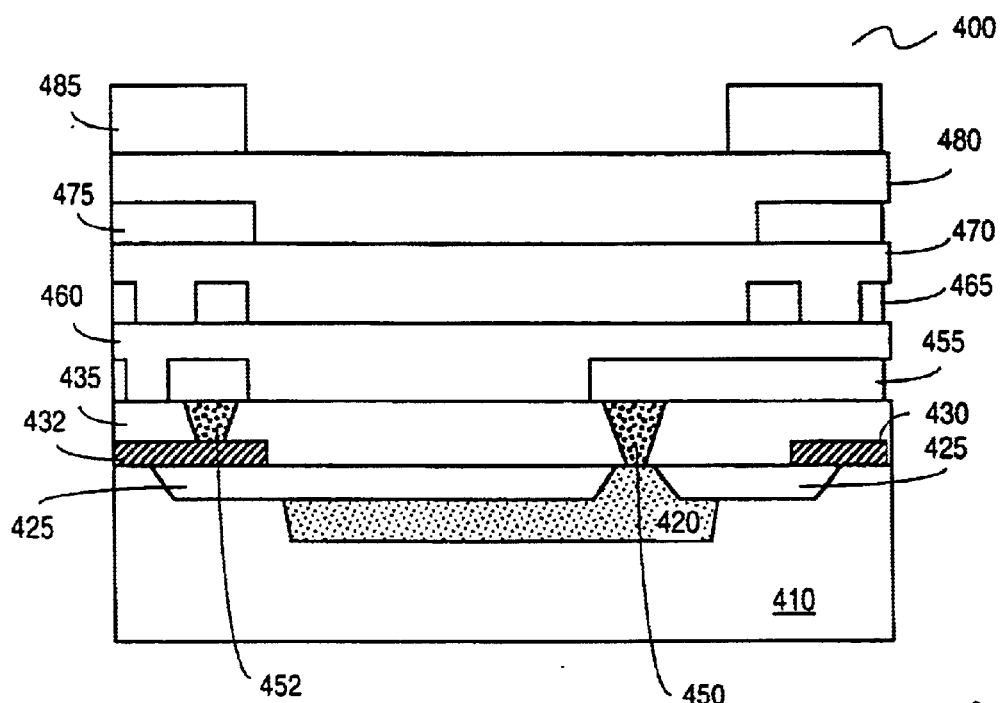
FIG. 4j shows the pixel of FIG. 4a after the subsequent processing step of depositing and patterning a fourth metal layer over the third dielectric layer.

FIG. 4j shows the pixel after the subsequent processing step of depositing and patterning a fourth metal layer 485 over ILD3 layer 480. Fourth metal layer 485 is, for example, electrically coupled to third metal layer 475 through conductive contacts through ILD3 layer 480.

Figure 4K:
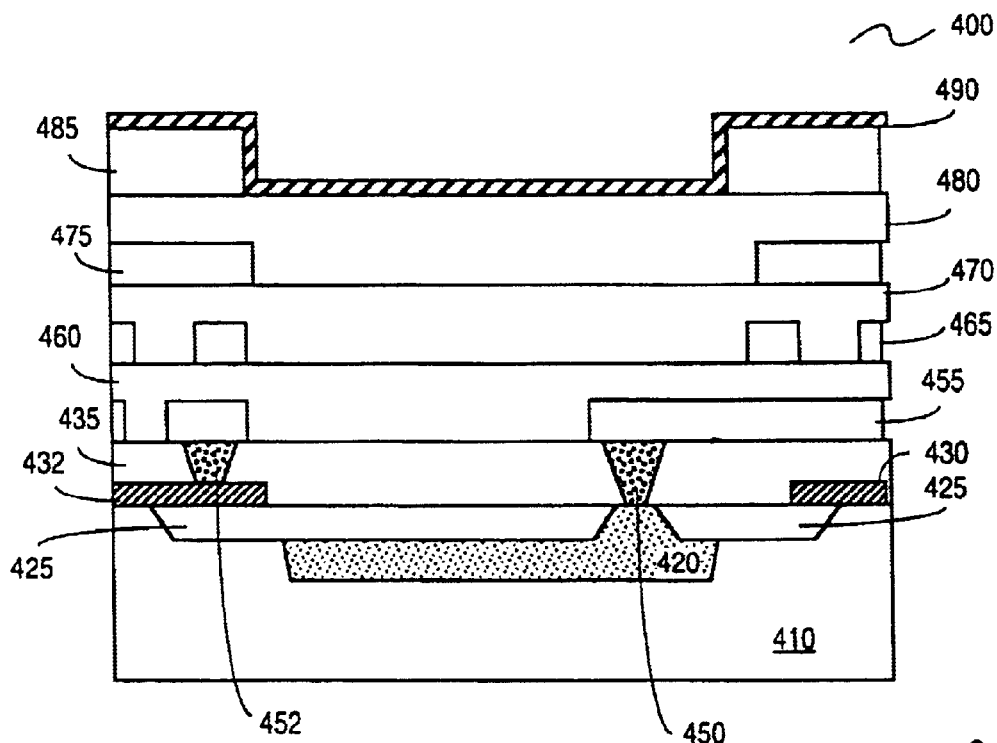
FIG. 4k shows the pixel of FIG. 4a after the subsequent processing step of depositing a passivation layer over the fourth metal layer.

FIG. 4k shows the pixel after the subsequent processing step of depositing a passivation layer 490 over fourth metal layer 485. Passivation layer 490 is, for example, $Si_3N_4$ or $Si_xN_yO_z$ conformally deposited to a thickness of approximately 8000 Å.

Overlying the photosensing structure of the pixel in the semiconductor substrate are interlayer dielectrics ILD0–ILD3 layers 435, 460, 470, and 480. A conventional dielectric for these layers is a silicon glass. Accordingly, ILD0–ILD3 layers are transmissive to light, i.e., White light, in the visible spectrum. Similarly, passivation layer 490 of $Si_3N_4$ or $Si_xN_yO_z$ is completely transmissive to light, White light, in the visible spectrum.

Figure 4L:
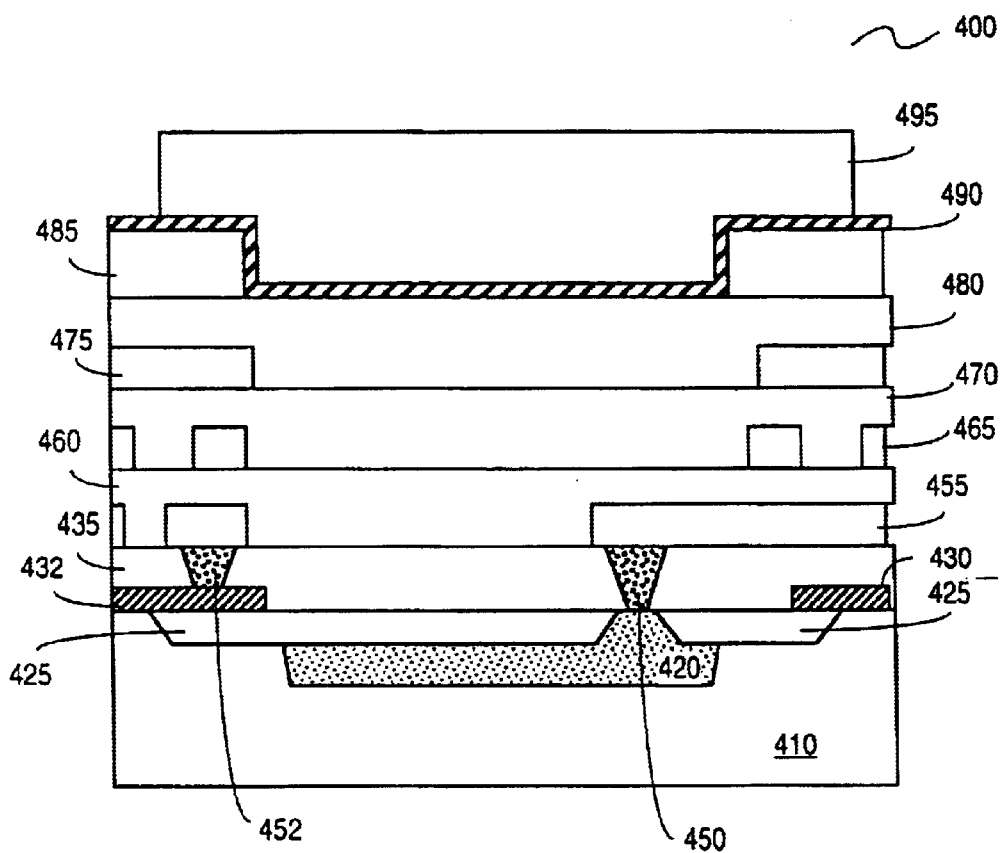
FIG. 4l shows the pixel of FIG. 4a after the processing step of depositing a color filter array material over the pixel.

FIG. 4l shows the pixel after the subsequent processing step of depositing a color filter material, such as for example a Red, Green, or Blue CFA material 495, over passivation layer 490. CFA material 495 includes filter material selective to light having, for example, a wavelength corresponding to the Red region of the visible spectrum. In other words, only light selective to light having a wavelength corresponding to the Red region of the visible spectrum will pass through Red CFA material 495.

Suitable materials for CFA material 495 in accordance with the invention include, but are not limited to, pigmented acrylates or photoresist, dyed-photoresist such as a novolack resin, and dyed polyimides. The choice of CFA material is generally pigmented or dyed photoresist. Pigmented photoresist generally has better environmental stability than dyed photoresist and is, for this reason, favored over dyed photoresist. However, dyed photoresist produces better homogeneity and a better color scheme. Dyed material generally requires less color correction (e.g., software manipulation) than pigmented material. Dyed material is also easier to work with from a process standpoint. Dyed material generally is present in a single phase while pigmented material is made up of multiple phases. The multiple phases are difficult to keep suspended and create yield problems. The invention contemplates process steps that minimize the degradation of dyed-photoresist by environmental effects. Thus, dyed-photoresist may be used where desired.

In the case of a pigmented- or dyed-photoresist, the material is conformally spun over passivation layer 490 across the top of a wafer containing the sensor array including pixel 400. Photoresist layer 495 is patterned by exposing areas over the wafer where desired pixels for the colored selective light are to be located. Photoresist layer 495 is then exposed to light, such as for example ultraviolet light, to cross-link or polymerize the photoresist. After exposure, the layer is sprayed with a developer and the non-polymerized portion is washed away leaving colored light selective areas 495 over the desired pixels of the array(s) of the wafer.

To complete the color system, e.g., an RGB color system, the process described above with respect to the first (or Red) CFA material is repeated with color filter material sensitive to light having a wavelength corresponding to a second (e.g., Green) region of the visible spectrum. The process is then repeated with color filter material sensitive to light having a wavelength-corresponding to a third (e.g., Blue) region of the visible spectrum. It is to appreciated that the invention illustratively presented a deposition process involving the deposition and patterning of the Red, Green, and Blue CFA materials in that order. The illustration is not intended to limit the invention or the process of forming the invention to that particular color system or to that particular deposition order or technique.

Figure 4M:
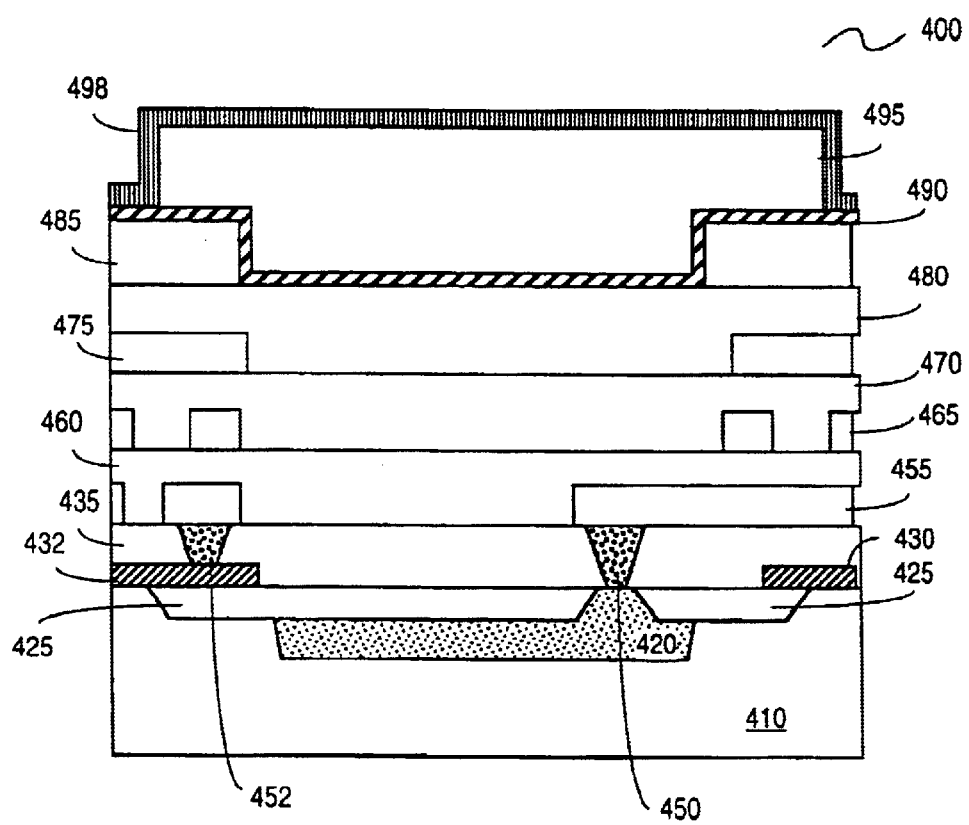
FIG. 4m shows the pixel of FIG. 4a after the processing step of depositing a silylation material over the pixel.

FIG. 4m illustrates the pixel after the subsequent processing step of depositing a silylation layer 498 over CFA material layer 495 in accordance with the invention. In this embodiment, the deposition of silylation layer 498 follows the deposition patterning, and curing of each of the CFA material of the chosen color system. Silylation layer 498 acts as a sealer to seal or protect the CFA material from exposure to moisture or degradation by temperature fluctuations. Silylation layer 498 is a transparent material that can be used over the area above the photosensing structure of pixel 400 (i.e., over sensor area 210 of sensor 175 of FIGS. 3a and 3b) without affecting the responsivity of the photosensing region.

Silylation layer 498 is of a transparent material of a methacrylic acid or its derivatives including its esters and polymers and copolymers and combinations thereof. Other suitable silylation materials include silanes and silane derivatives including, but not limited to, hexamethyldisilazane (HMDS), hexamethylcyclotrisilane (HMCTS), methacryloxypropyltrimathoxysilane, isobutlxyaluminoxytriethoxysilane, 3-glycidoxypropyltrimethylsilane, vinyltrimethoxysilane, methacryloxypropyltrimethoxysilane, and tetresethoxysilane and variations and combinations thereof. Propoxides and propoxide derivatives including, but not limtied to, zirconium(IV)-m-propoxide, titanium(IV)-propoxide, and titanium-isoproxide, and variations and combinations thereof are also suitable. Still other suitable materials include the silicates and silicate derivatives such as but not limited to, tetraethylorthosilicate, tetramethylorthosilicate and variations and combinations thereof. Other materials such as 4-hydroxycyclohexylphenylbenzene and 1-hydroxycyclohexylpherylketone and variations and combinations thereof are also suitable. It is to be appreciated that there are many suitable compounds that are transparent and may be utilized as a silylation layer and applied with conventional processing (e.g., deposition) techniques in accordance with the spirit and scope of the invention.

Silylation layer 498 is deposited to a thickness so as to seal and protect CFA material 495. A suitable thickness of silylation layer 498 includes, but is not limited to, 1–3 microns. Thicker layers may be used but care should be taken to avoid degrading light transmissivity.

In one embodiment, the deposition of silylation layer 498 is similar to the deposition of a positive photoresist. In the case of a photodefineable material, the silylation layer 498 is spun over sensor 400. Areas to be covered by silylation layer 498, including the area above the photosensing structure, are exposed while areas desired to be unprotected by silylation layer 498 are protected by a mask. Silylation layer material is then exposed to a suitable light source, for example, an ultraviolet light source and the exposed areas cross-link or polymerize, the mask is then removed and the unexposed areas are washed away with a developing solution. The sensor is then cured to further cross-link or polymerize the silylation layer 498.

Silylation layer 498 acts as a sealant to protect CFA material layer 495 from degradation. Silylation layer 498 is particularly useful to protect CFA material 495 from degradation by moisture or temperature. Thus, whereas prior art image sensors did not seal or protect CFA material layer by direct application of a sealant, the invention contemplates a sealant in the form of a silylation layer 498 directly on CFA material.

Figure 6:
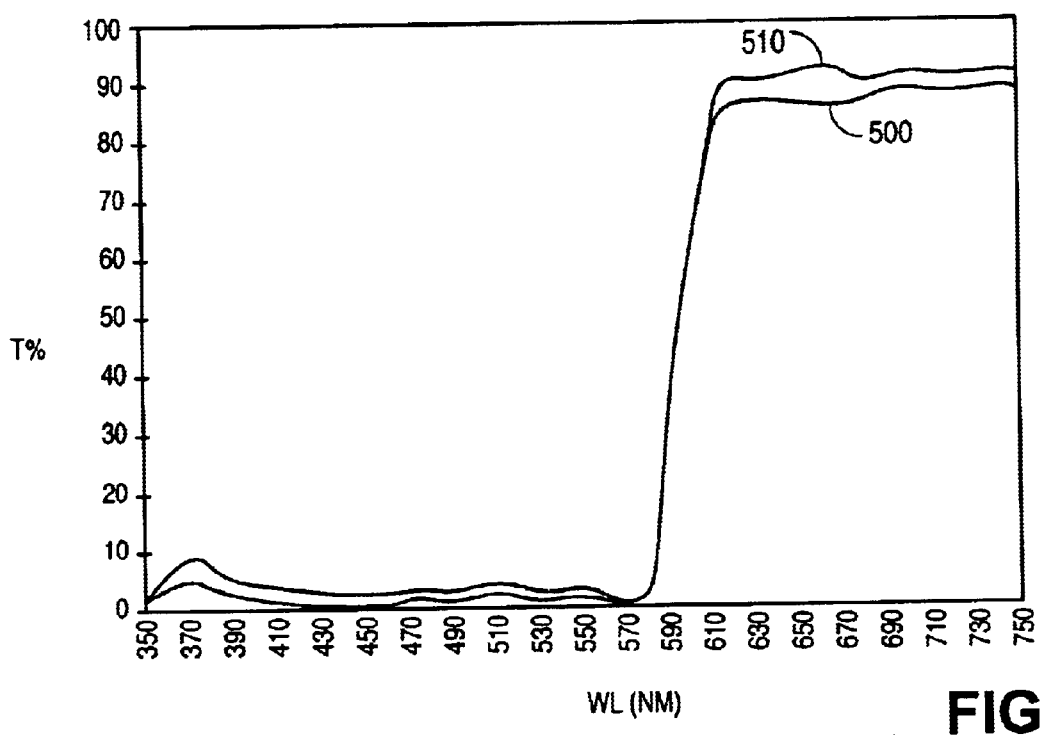
FIG. 6 is a graphical representation of a comparison of the transmissivity of silylation-protected and silylation-unprotected Red CFA material.
Figure 7:
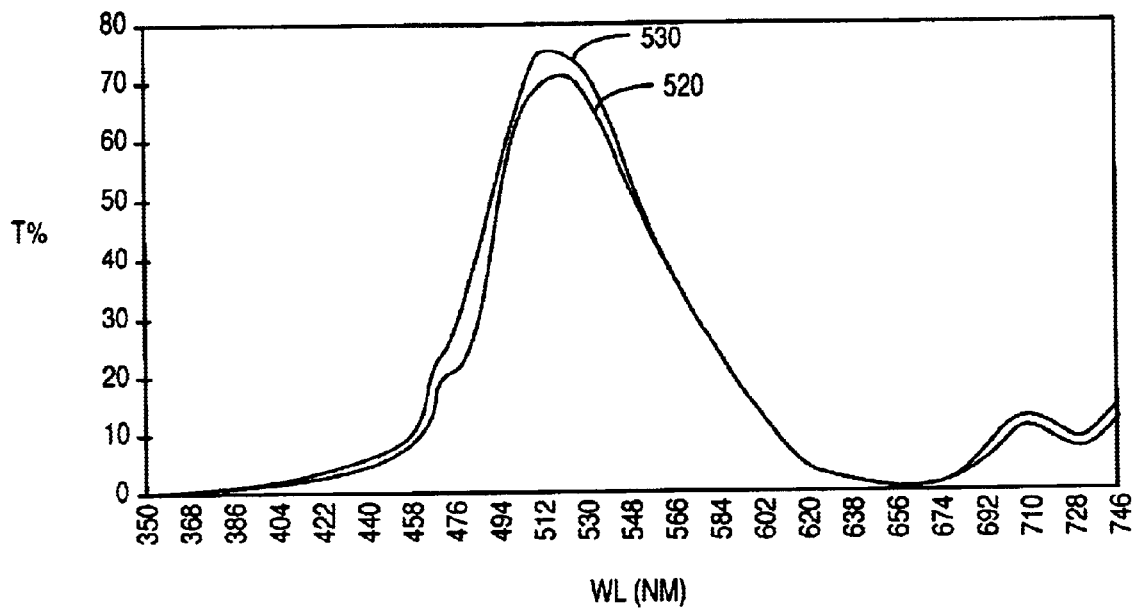
FIG. 7 is a graphical representation of a comparison of the transmissivity of silylation-protected and silylation-unprotected Green CFA material.
Figure 8:
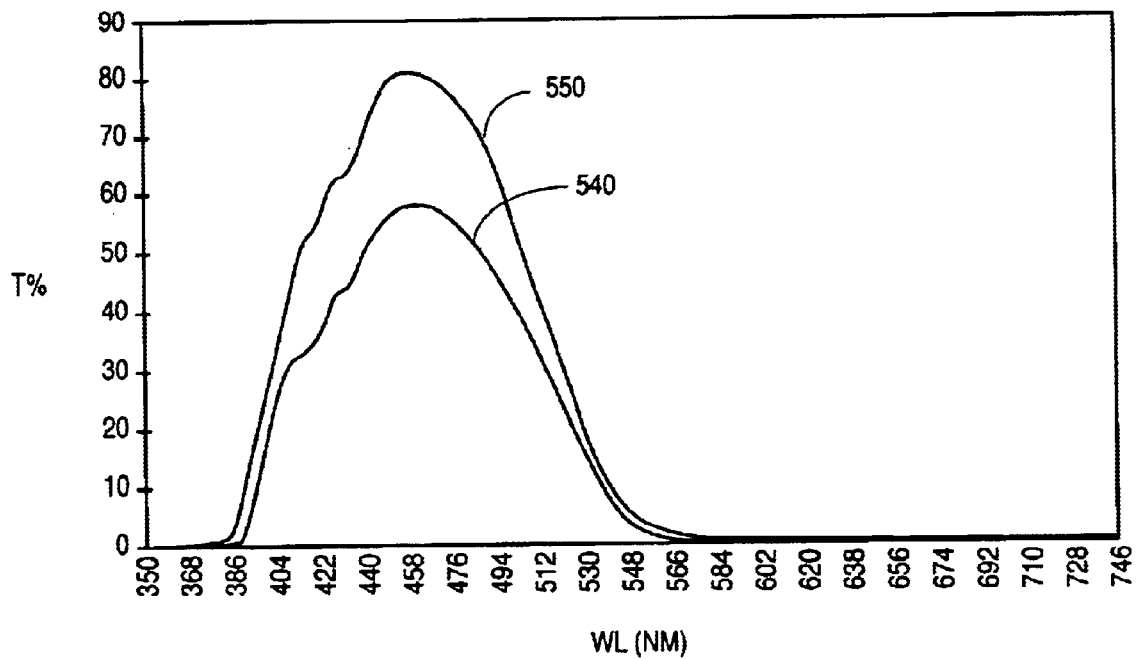
FIG. 8 is a graphical representation of a comparison of the transmissivity of silylation-protected and silylation-unprotected Blue CFA material.

FIGS. 6–8 show graphical representations of the transmissivity of silylation-protected and silylation-unprotected Red, Green, and Blue pigmented CFA materials, respectively, that are exposed to elevated temperature and humidity. The experimental conditions included exposing the CFA materials to a temperatures up to 250° C. for ten hours and humidity of 85 percent for 500 hours. The specific experimental conditions are set forth below:

1) Temp.=130 (time 10, 24, 48, 72, 100, 250, 500 hrs)
   Temp.=150 (time 10, 24, 48, 72, 100, 250, 500 hrs)
   Temp.=180 (time 10, 24, 48, 72, 100, 250, 500 hrs)
2) Temp.=200 (time 5, 10, 30 min, 1 hr, 2 hr, 3 hr, 24 hr)
   Temp.=210 (time 5, 10, 30 min, 1 hr, 2 hr, 3 hr, 24 hr)
   Temp.=220 (time 5, 10, 30 min, 1 hr, 2 hr, 3 hr, 24 hr)
   Temp.=230 (time 5, 10, 30 min, 1 hr, 2 hr, 3 hr, 24 hr)
   Temp.=240 (time 5, 10, 30 min, 1 hr, 2 hr, 3 hr, 24 hr)
   Temp.=250 (time 5, 10, 30 min, 1 hr, 2 hr, 3 hr, 24 hr)
3) Humidity 85%/Temp.=85 (time 10, 24, 72, 100, 25, 500 hrs) Humidity 85%/Temp.=135 (time 10, 24, 72, 100, 25, 500 hrs)

Each figure represents the percent transmission through the CFA material plotted against its wavelength. FIG. 6 shows Red CFA material 500 having a maximum transmissivity of approximately 85 percent under the various experimental conditions. That same Red CFA material covered by silylation layer (represented as reference 510) has a transmissivity throughout the Red wavelength range (approximately 590–750 nanometers) of 90 percent or more transmissivity. FIG. 7 shows similar results for Green CFA material. Unprotected CFA material layer 520 has a maximum transmissivity of about 70 percent at 530 nanometers. The same CFA material protected by a silylation (represented by reference 530) shows the transmissivity of about 73 percent at the same wavelength, a perhaps negligible difference. FIG. 8 shows similar results for Blue CFA material of 55 percent transmissivity for unprotected CFA material 540 and 80 percent for silylation layer-protected CFA material 550 at 450 nanometers. Thus, FIGS. 6–8 illustrate the benefits of the protection offered by use of a silylation, particularly with Blue pigmented-CFA material. Similar results would be obtained with dyed material.

Figure 5:
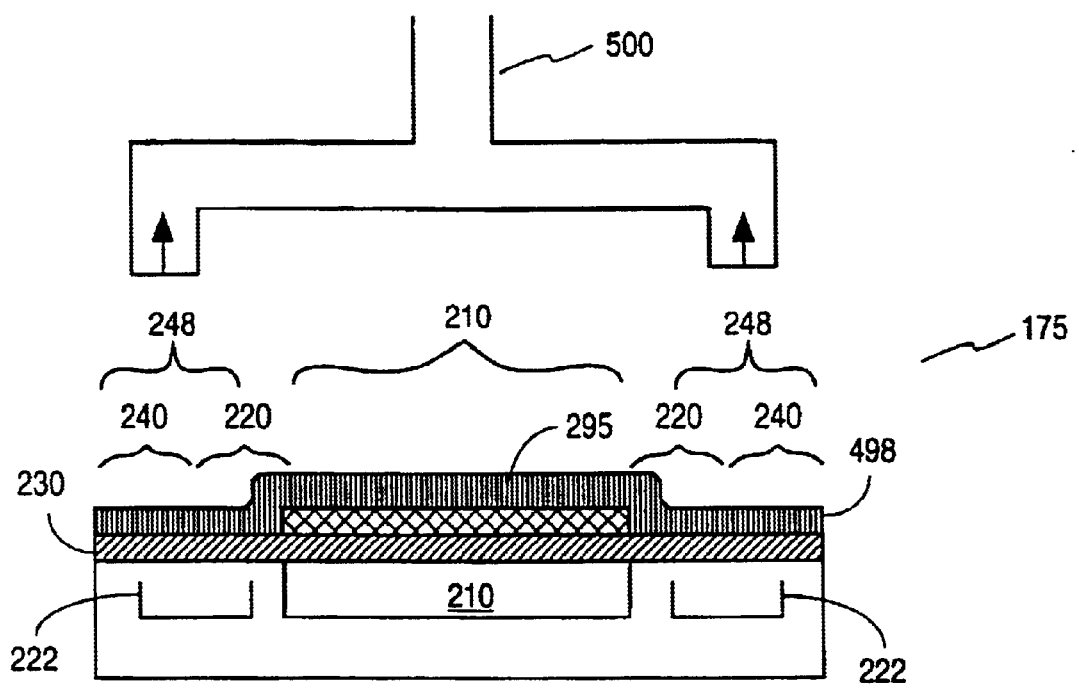
FIG. 5 shows a schematic side view of the imaging sensor of FIG. 3a after the further processing step of depositing a silylation material over the top surface of the sensor.

Since, in one embodiment, silylation layer 498 is transparent and durable, silylation layer 498 may also be used as a sealant over non-photosensitive areas of image sensor 175. In this manner, silylation layer 498 may be used as a scratch protection layer. FIG. 5 illustrates a side view of image sensor 175 such as the image sensor described with reference to FIGS. 3(a)–3(b) and formed in accordance with the processing steps of FIGS. 4(a)–4(m). In FIG. 5, image sensor 175 includes a CFA material array layer 295 overlying sensor area 210.

With reference to FIG. 5 scratch protection area 248 represents a portion of the non-sensor area defined, in one embodiment, by portion of logic area 220 and bond pad area 240. Scratch protection area 248, among other things, is an area of image sensor 175 that is utilized during high-volume assembly pick-and-place processes. In the device pick-and-place process, an individual image sensor 175 is selected from a divided wafer, for example, by collet 500 at the sensor scratch protection area and transferred via the collet into a package. Any contact between image sensor 175 and the collet occurs over scratch protection area 248. Thus, any scratching of silylation layer 498 occurs over scratch protection area 248 and not over sensor area 210.

In prior art structures, scratch protection area 248 is covered with a passivation material (e.g., $Si_3N_4$) or CFA material. A drawback to $Si_3N_4$ as a scratch protection material is its tendency to crack when contacted by a collet. A drawback to CFA material is its color selectivity. By covering light sensitive components present in otherwise non-photosensitive areas, like a flicker diode-conventionally used to measure frequency and correct the clock cycle— with a CFA material, the light sensitive component is compromised.

Silylation layer 498, deposited over both CFA material layer 295 and scratch protection area 248, can replace other materials that have been used or contemplated for use as a scratch protection layer in non-photosensitive areas of sensor 400, including $Si_3N_4$ and excess CFA material. The materials chosen for silylation layer 498 do not form brittle structures like $Si_3N_4$ so the layer makes sensor 175 more durable for handling purposes. Since silylation layer 498 is transparent, use as a scratch protection layer offers the additional benefit of providing a transparent scratch protection layer over, for example, a flicker diode that is generally placed in a non-sensor or logic area of sensor 400.

In addition to the above advantages, silylation layer 498 may eliminate the need for the top glass layer in the packaging of the sensor. In the embodiment described in FIG. 2, package 105 includes a transparent glass cover layer 171 that encases image sensor 175 in package 105. Glass cover layer 171 serves, in one manner, to protect sensor 175 from deleterious environmental effects. Since, silylation layer 498 serves a similar function directly over sensor 175, the need for glass cover layer 171 is eliminated. Thus, the inclusion of silylation layer 498 reduces the piece-part count of the imaging system.

The invention described above referenced a CMOS image sensor. It is to be appreciated that the invention is not limited to CMOS image sensors, but may be incorporated into other sensors including, but not limited to, charge coupled device (CCD) sensors. The invention described herein is also suitable for use with other optical devices, including, but not limited to, liquid crystal display devices, such as, for example, to replace a filter plate component of the display device. The invention contemplates uses with any optical device that could benefit from a transparent, durable coating.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. An optical device comprising:

a monolayer of a first color filter material overlying an area over a first photosensitive region and adapted to select light corresponding to a determined wavelength to be absorbed by the first photosensitive region;

a monolayer of a second color filter material overlying an area over a second different photosensitive region and adapted to select light corresponding to a determined wavelength to be absorbed by the second photosensitive region; and a silylation layer overlying and in physical contact with each of the first color filter material and the second color filter material as the exposed surface of the optical device wherein the silylation layer is comprised of a material selected from at least one of zirconium (IV)-n-propoxide, titanium (IV)-propoxide, titanium-isoproxide, tetraethyorthosilicate, tetramethylorthosilicate, 4-hydroxycyclohexylphenylbenzene, and 1-hydroxycyclohexylphenylketone.

2. An optical device comprising:

a layer of color filter material overlying an area over a photosensitive portion to select light incident on the device corresponding to a determined wavelength; and a silylation layer coating a portion of the color filter material as the exposed surface of the optical device, wherein the silylation layer is comprised of material selected from at least one of zirconium (IV)-n-propoxide, titanium (IV)-propoxide, titanium-isoproxide, tetraethylorthosilicate, tetramethylorthosilicate, 4-hydroxycyclohexylphenylbenzene, and 1-hydroxycyclohexylphenylketone.

3. An imaging system comprising:

an imaging sensor of an integrated circuit having a sensor portion with a plurality of photocells providing sensor signals in response to incident light and control signals and a non-sensor portion, a layer of color filter material overlying the sensor portion, the layer of color filter material adapted to select light incident on the sensor corresponding to a determined wavelength and a silylation layer coating a portion of the layer of color filter material in an area over the sensor portion as the exposed surface of the optical device, wherein the silylation layer is comprised of material selected from at least one of zirconium (IV)-n-propoxide, titanium (IV)-propoxide, titanium-isoproxide, tetraethylorthosilicate, tetramethylorthosilicate, 4-hydroxycyclohexylphenylbenzene, and 1-hydroxycyclohexylphenylketone;

control circuitry configured to generate the control signals for controlling the imaging sensor; and signal processing circuitry for generating image data in response to the sensor signals.

4. An optical device comprising:

a monolayer of a first color filter material overlying an area over a first photosensitive region and adapted to select light corresponding to a determined wavelength to be absorbed by the first photosensitive region;

a monolayer of a second color filter material overlying an area over a second different photosensitive region and adapted to select light corresponding to a determined wavelength to be absorbed by the second photosensitive region; and a silylation layer overlying and in physical contact with each of the first color filter material and the second color filter material as the exposed surface of the optical device wherein the silylation layer is selected from the group consisting of propoxides and propoxide derivatives.

* * * * *